(12) United States Patent
Kigami et al.

(10) Patent No.: US 12,060,263 B2
(45) Date of Patent: Aug. 13, 2024

(54) PROTECTIVE COVER MEMBER AND MEMBER SUPPLYING SHEET

(71) Applicant: NITTO DENKO CORPORATION, Osaka (JP)

(72) Inventors: Hiroki Kigami, Osaka (JP); Kenji Onishi, Osaka (JP)

(73) Assignee: NITTO DENKO CORPORATION, Osaka (JP)

(*) Notice: Subject to any disclaimer, the term of this patent is extended or adjusted under 35 U.S.C. 154(b) by 0 days.

(21) Appl. No.: 17/801,070

(22) PCT Filed: Aug. 5, 2021

(86) PCT No.: PCT/JP2021/029213
§ 371 (c)(1),
(2) Date: Aug. 19, 2022

(87) PCT Pub. No.: WO2022/030604
PCT Pub. Date: Feb. 10, 2022

(65) Prior Publication Data
US 2023/0159321 A1  May 25, 2023

(30) Foreign Application Priority Data

Aug. 7, 2020 (JP) ................................ 2020-135164

(51) Int. Cl.
  *C09J 7/35* (2018.01)
  *B81B 7/00* (2006.01)
  *C09J 133/08* (2006.01)

(52) U.S. Cl.
  CPC .............. *B81B 7/0029* (2013.01); *C09J 7/35* (2018.01); *C09J 133/08* (2013.01); *C09J 2203/326* (2013.01); *C09J 2301/304* (2020.08); *C09J 2301/312* (2020.08); *H01L 2924/1461* (2013.01); *Y10T 428/2891* (2015.01)

(58) Field of Classification Search
None
See application file for complete search history.

(56) References Cited

U.S. PATENT DOCUMENTS

| 2009/0268928 A1 | 10/2009 | Ikeyama et al. |
| 2011/0120614 A1 | 5/2011 | Sugo et al. |
| 2011/0138762 A1 | 6/2011 | Ueki et al. |
| 2011/0229697 A1* | 9/2011 | Namikawa ........ H01L 21/67028 428/189 |
| 2012/0231583 A1* | 9/2012 | Onishi ..................... H01L 24/27 524/508 |
| 2013/0005915 A1 | 1/2013 | Suzuki et al. |
| 2014/0079268 A1 | 3/2014 | Karube et al. |
| 2023/0108896 A1* | 4/2023 | Kigami ..................... C09J 7/29 156/329 |

FOREIGN PATENT DOCUMENTS

| JP | S63-312379 A | 12/1988 |
| JP | H7-76672 A | 3/1995 |
| JP | H8-148815 A | 6/1996 |
| JP | 2002-249737 A | 9/2002 |
| JP | 2007-81881 A | 3/2007 |
| JP | 2010-464 A | 1/2010 |
| JP | 2011-135042 A | 7/2011 |
| JP | 2012-229372 A | 11/2012 |
| JP | 2012-253481 A | 12/2012 |
| JP | 2017-139408 A | 8/2017 |
| JP | 2019-209689 A | 12/2019 |
| WO | WO 2015/152010 A1 | 10/2015 |
| WO | WO 2019/089021 A1 | 5/2019 |

OTHER PUBLICATIONS

ISR for PCT/JP2021/029213, dated Sep. 28, 2021.
Written Opinion of ISA for PCT/JP2021/029213, dated Sep. 28, 2021 (w/ translation).

* cited by examiner

*Primary Examiner* — Anish P Desai
(74) *Attorney, Agent, or Firm* — GREENBLUM & BERNSTEIN, P.L.C.

(57) ABSTRACT

A provided protective cover member is a protective cover member configured to be placed on a face of an object, the face having an opening. The protective cover member includes a laminate, and the laminate includes: a protective membrane having a shape configured to cover the opening when the member is placed on the face; and an adhesive agent layer. The adhesive agent layer includes a thermosetting adhesive layer including a thermosetting resin composition. The thermosetting resin composition has a storage modulus of $1 \times 10^5$ Pa or more at 130 to 170° C. The above protective cover member is suitable for reducing deformation thereof and/or peeling thereof from a placement face in a high-temperature treatment such as reflow soldering.

17 Claims, 4 Drawing Sheets

Example 1

Example 2

Example 3

Example 4

Comparative Example 1

Comparative Example 2

Comparative Example 3

Comparative Example 4

Comparative Example 5

Comparative Example 6

PROTECTIVE COVER MEMBER AND MEMBER SUPPLYING SHEET

TECHNICAL FIELD

The present invention relates to a protective cover member configured to be placed on a face of an object, the face having an opening, and a member supplying tape for supplying the member.

BACKGROUND ART

Protective cover members configured to be placed on a face of an object to prevent entrance of a foreign matter into an opening of the face are known. Generally, a protective cover member includes: a protective membrane that prevents entrance of a foreign matter into an opening when the member is placed on a face having the opening; and an adhesive agent layer that fixes the member to the face. Patent Literature 1 discloses a member including: a porous membrane including polytetrafluoroethylene (hereinafter referred to as "PTFE") as a main component and allowing gas and/or sound to pass therethrough but blocking a foreign matter such as a water drop from passing therethrough; and a heat-resistant double-sided adhesive sheet placed on a limited region of at least one principal surface of the porous membrane in order to fix the porous membrane to another component. Patent Literature 1 focuses a substrate of the heat-resistant double-sided adhesive sheet configured to fix the member to a surface of a circuit board which is an object to achieve heat resistance of the member at high temperatures in reflow soldering.

CITATION LIST

Patent Literature

Patent Literature 1: JP 2007-081881 A

SUMMARY OF INVENTION

Technical Problem

Recently, there is a demand for placement of a protective cover member over an opening of a tiny product such as a micro electro mechanical system (hereinafter referred to as "MEMS"). There is also a demand for placement of a protective cover member on a face inside such a product as well as on an outer surface. To satisfy the demands, the area of such a protective membrane has been more and more decreased. Under such circumstances, decreasing the area of an adhesive agent layer that prevents passage of gas and sound, such as decreasing the width of the adhesive agent layer placed in a peripheral portion of the protective membrane, is forced in order to allow passage of gas and/or sound through the protective membrane as much as possible. According to studies by the present inventors, in the case where the area of an adhesive agent layer is decreased, deformation of a protective cover member and peeling of a protective cover member from the above face (placement face) tend to be observed after a high-temperature treatment such as reflow soldering. The above circumstance is not considered in Patent Literature 1.

The present invention aims to provide a protective cover member suitable for reducing deformation thereof and/or peeling thereof from a placement face in a high-temperature treatment such as reflow soldering.

Solution to Problem

The present invention provides a protective cover member configured to be placed on a face of an object, the face having an opening, the protective cover member including a laminate, wherein
the laminate includes: a protective membrane having a shape configured to cover the opening when the member is placed on the face; and an adhesive agent layer,
the adhesive agent layer includes a thermosetting adhesive layer including a thermosetting resin composition, and
the thermosetting resin composition has a storage modulus of $1 \times 10^5$ Pa or more at 130 to 170° C.

In another aspect, the present invention provides a member supplying sheet including:
a substrate sheet; and
at least one protective cover member placed on the substrate sheet, wherein
the protective cover member is the above protective cover member of the present invention.

Advantageous Effects of Invention

According to studies by the present inventors, one of the causes of the above-described deformation and peeling is shrinking of a protective membrane at high temperatures. In the protective cover member of the present invention, the adhesive agent layer includes the thermosetting adhesive layer including the thermosetting resin composition. The thermosetting adhesive layer including the thermosetting resin composition is thermally cured at high temperatures, and the adhesive layer after thermal curing (a cured adhesive layer) has a lower flowability at high temperatures than a layer formed of a non-curable pressure-sensitive adhesive agent and commonly used as an adhesive agent layer. Therefore, it is expected that shrinking of the protective membrane at high temperatures is reduced by supporting the protective membrane using the adhesive agent layer including the above thermosetting adhesive layer. However, according to further studies by the present inventors, when the area of an adhesive agent layer is reduced, the low flowability as the cured adhesive layer at high temperatures is insufficient; it is further important to lower, during thermal curing performed to form the cured adhesive layer, a flow of a thermosetting adhesive layer so as to form the cured adhesive layer at an accurate position and in an accurate shape. In the protective cover member of the present invention, the thermosetting resin composition has a storage modulus of $1 \times 10^5$ Pa or more at 130 to 170° C. which corresponds to a temperature range in which thermal curing starts to progress. This storage modulus indicates a lowered flowability of the thermosetting adhesive layer during thermal curing. Therefore, the protective cover member of the present invention is suitable for reducing deformation thereof and/or peeling thereof from a placement face in a high-temperature treatment such as reflow soldering.

DESCRIPTION OF EMBODIMENTS

Embodiments of the present invention will be described with reference to the drawings. The present invention is not limited to the following embodiments.

[Protective Cover Member]

Figure 1A:
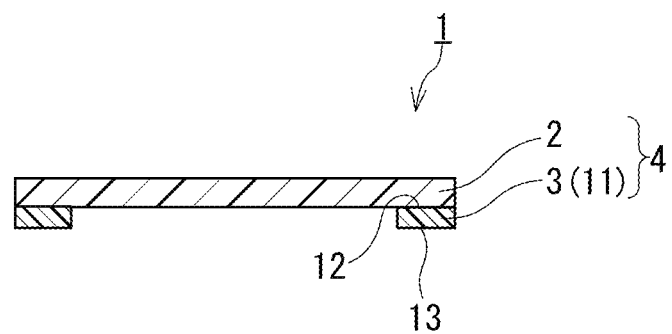
FIG. 1A is a cross-sectional view schematically showing an example of a protective cover member of the present invention.
Figure 1B:
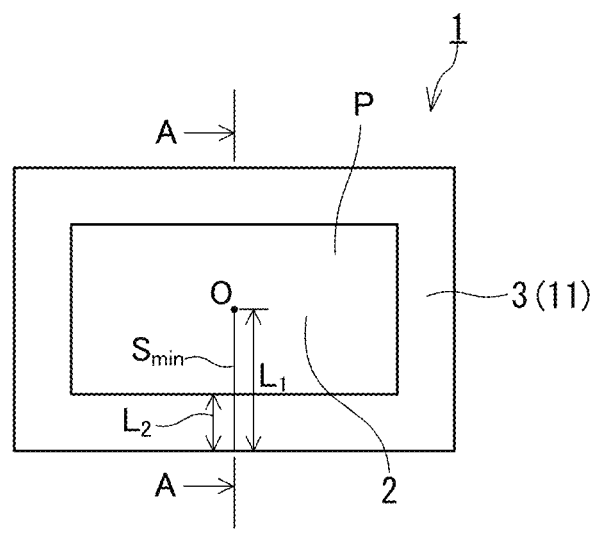
FIG. 1B is a plan view of the protective cover member 1 of FIG. 1A viewed from an adhesive agent layer 3 side.

FIGS. 1A and 1B show an example of a protective cover member of the present embodiment. FIG. 1B is a plan view of the protective cover member 1 of FIG. 1A viewed from an adhesive agent layer 3 side. FIG. 1A shows a cross-section A-A of FIG. 1B. The protective cover member 1 is a member configured to be placed on a face (placement face) of an object, the face having an opening. By placing the protective cover member 1 on the placement face, for example, entrance of a foreign matter into and/or from the opening, i.e., entrance of a foreign matter through the opening, can be prevented. The protective cover member 1 may be a member configured to be placed on a face of an object to prevent entrance of a foreign matter into an opening of the face. The protective cover member 1 includes a laminate 4 including a protective membrane 2 and an adhesive agent layer 3. The protective membrane 2 has a shape configured to cover the opening when the protective cover member 1 is placed on the face. The adhesive agent layer 3 is located on one principal surface side of the protective membrane 2. The adhesive agent layer 3 is joined to the protective membrane 2. The protective cover member 1 can be fixed to the placement face of the object by the adhesive agent layer 3.

The adhesive agent layer 3 includes a thermosetting adhesive layer 11 formed of a thermosetting resin composition A (hereinafter referred to as "composition A"). The thermosetting adhesive layer 11 includes the composition A, and has a certain degree of adhesiveness. The thermosetting adhesive layer 11 is formed, for example, by applying and drying the composition A. The adhesive agent layer 3 of FIGS. 1A and 1B is formed of the thermosetting adhesive layer 11. One principal surface 12 of the thermosetting adhesive layer 11 is in contact with the protective membrane 2. The other principal surface of the thermosetting adhesive layer 11 is a joining surface 13 of the protective cover member 1 to be joined to a placement face of an object.

The composition A has a storage modulus $G'_B$ of $1 \times 10^5$ Pa or more at 130 to 170° C. The storage modulus $G'_B$ may be $2.5 \times 10^5$ Pa or more, $2.9 \times 10^5$ Pa or more, $3 \times 10^5$ Pa or more, $3.4 \times 10^5$ Pa or more, $4 \times 10^5$ Pa or more, $4.5 \times 10^5$ Pa or more, $4.8 \times 10^5$ Pa or more, or even $5 \times 10^5$ Pa or more in the above temperature range. The upper limit of the storage modulus $G'_B$ is, for example, $1 \times 10^7$ Pa or less in the above temperature range. The storage modulus $G'_B$ in the above range can reduce a flow of the thermosetting adhesive layer 11 during thermal curing performed for the composition A to form a cured adhesive layer even when the adhesive agent layer 3 (thermosetting adhesive layer 11) has a reduced area. The storage modulus $G'_B$ is defined as a storage modulus $G'$ at 130 to 170° C., the storage modulus $G'$ being evaluated for a film (22.5 mm in length and 10 mm in width) serving as a test piece and formed of the composition A while the test piece is being heated, for example, from 0° C. to 260° C. at a temperature increase rate of 10° C./min using a forced vibration viscoelastic analyzer for solids. It should be noted that the direction of measurement (direction of vibration) of the test piece is set to a longitudinal direction of the test piece, and the vibration frequency is set to 1 Hz.

The storage modulus $G'_A$ of the composition A after thermal curing may be $5 \times 10^5$ Pa or more at 250° C. which corresponds to the temperature for a high-temperature treatment. The storage modulus $G'_A$ may be $8 \times 10^5$ Pa or more, $1 \times 10^6$ Pa or more, or even $2 \times 10^6$ Pa or more at the above temperature. The upper limit of the storage modulus $G'_A$ is, for example, $1 \times 10^9$ Pa or less at the above temperature. The storage modulus $G'_A$ in the above range can further reduce the flowability of the adhesive agent layer 3 in a high-temperature treatment such as reflow soldering even when the adhesive agent layer 3 (the thermosetting adhesive layer 11) has a reduced area.

The composition A is, for example, an acrylic composition including an acrylic polymer. The acrylic composition normally includes an acrylic polymer (hereinafter referred to as "acrylic polymer B") as a base polymer of an adhesive agent composition. A content of the acrylic polymer B in the acrylic composition is, for example, 35 weight % or more, and may be 40 weight % or more, 50 weight % or more, 60 weight % or more, 70 weight % or more, 80 weight % or more, or even 90 weight % or more. The upper limit of the content of the acrylic polymer B is, for example, 100 weight % or less, and may be 95 weight % or less, or even 90 weight % or less.

The acrylic polymer B preferably has a weight-average molecular weight of 200,000 or more, and may have a weight-average molecular weight of 400,000 or more, 600,000 or more, 800,000 or more, or even 1,000,000 or more. The upper limit of the weight-average molecular weight of the acrylic polymer B is, for example, 5,000,000 or less. The weight-average molecular weight of the acrylic polymer B affects the storage modulus $G'_B$ of the composition A. When the weight-average molecular weight of the acrylic polymer B is in the above range, the storage modulus $G'_B$ can be in the above range more reliably.

In the composition A, the acrylic polymer B having a weight-average molecular weight of 200,000 or more may be included at a content of 35 weight % or more. In this case, the storage modulus $G'_B$ can be in the above range more reliably.

The composition A that is thermally curable includes a thermosetting group. The thermosetting group is, for example, at least one selected from a group consisting of an epoxy group, a hydroxyphenyl group, a carboxy group, a hydroxy group, a carbonyl group, an aziridinyl group, and an amino group. When the thermosetting group is at least one selected from a group consisting of an epoxy group, a hydroxyphenyl group, and a carboxy group, particularly when the thermosetting group is an epoxy group and/or a hydroxyphenyl group, the heat resistance of the cured adhesive layer resulting from thermal curing is improved and the storage modulus $G'_A$ can be in the above range more reliably. It should be noted that the epoxy group includes a glycidyl group.

In the composition A, the acrylic polymer B may have a thermosetting group. In this case, compared to a later-described case where a thermosetting resin has a thermosetting group, a crosslinking structure resulting from thermal curing can be uniform, the heat resistance of the cured adhesive layer resulting from thermal curing can be improved, and the storage modulus $G'_A$ can be in the above range reliably. The thermosetting group that the acrylic polymer B can have is, for example, at least one selected from a group consisting of an epoxy group, a carboxy group, a hydroxy group, a carbonyl group, an aziridinyl group, and an amino group. The thermosetting group that the acrylic polymer B can have is preferably an epoxy group and/or a carboxy group, and is more preferably an epoxy group.

The acrylic polymer B has a glass transition temperature (Tg) of, for example, −15 to 40° C., and may have a glass transition temperature (Tg) of −10 to 30° C., or even −5 to 20° C.

The composition A may further include a thermosetting resin. In this case, a content of the thermosetting resin in the composition A is preferably smaller than the content of the acrylic polymer B in the composition A. The greater the content of the acrylic polymer B in the composition A is, the more greatly the storage modulus $G'13$ improves. Therefore, the storage modulus $G'_B$ is allowed to be in the above range more reliably by controlling the content of the acrylic polymer B and the content of the thermosetting resin. The thermosetting resin may have a thermosetting group, and the thermosetting resin having the thermosetting group can function as a crosslinking agent. Examples of the thermosetting group are as described above.

The content of the thermosetting resin in the composition A is, for example, 50 weight % or less, and may be 40 weight % or less, 35 weight % or less, 30 weight % or less, 20 weight % or less, 15 weight % or less, or even 10 weight % or less. The lower limit of the content of the thermosetting resin is, for example, 0 weight % or more, and may be 5 weight % or more. The thermosetting resin may not be included in the composition A.

Examples of the thermosetting resin include a phenolic resin, an epoxy resin, a urea resin, a melamine resin, and an unsaturated polyester resin. However, the thermosetting resin is not limited to the above examples. In the case where the thermosetting resin is a phenolic resin and/or an epoxy resin, particularly a phenolic resin, the heat resistance of the cured adhesive layer resulting from thermal curing can be improved and the storage modulus $G'_A$ can be in the above range more reliably.

Examples of the phenolic resin include novolac-type phenolic resins such as phenol novolac resin, phenol biphenyl resin, phenol aralkyl resin, cresol novolac resin, tert-butylphenol novolac resin, and nonylphenol novolac resin, and resol-type phenolic resins. However, the phenolic resin is not limited to the above examples.

A hydroxyl value of the phenolic resin is, for example, 100 to 500 g/eq, and may be 100 to 400 g/eq.

The thermosetting resin has a weight-average molecular weight of, for example, 100 to 3000, and may have a weight-average molecular weight of 150 to 2000.

The thermosetting resin can be formed by a known manufacturing method.

Examples of composition of the acrylic polymer B will be described. However, the acrylic polymer B is not limited to those having the following compositions.

The acrylic polymer B may have a structural unit C derived from at least one monomer selected from the following monomers: alkyl acrylates having an alkyl group having 1 to 8 carbon atoms, such as methyl acrylate, ethyl acrylate, propyl acrylate, butyl acrylate, pentyl acrylate, and hexyl acrylate; alkyl methacrylates having an alkyl group having 1 to 8 carbon atoms, such as methyl methacrylate, ethyl methacrylate, propyl methacrylate, butyl methacrylate, pentyl acrylate, and hexyl acrylate; acrylonitrile; styrene; carboxyl group-containing monomers, such as acrylic acid, methacrylic acid, carboxyethyl acrylate, carboxypentyl acrylate, itaconic acid, maleic acid, fumaric acid, and crotonic acid; acid anhydride monomers, such as maleic anhydride and itaconic anhydride; hydroxyl group-containing monomers, such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxymethyl cyclohexyl)-methyl acrylate; sulfonic acid group-containing monomers, such as styrenesulfonic acid, allylsulphonic acid, 2-(meth)acrylamido-2-methylpropanesulfonic acid, (meth)acrylamide propanesulfonic acid, sulfopropyl (meth)acrylate, and (meth)acryloyloxy naphthalenesulfonic acid; and phosphate group-containing monomers, such as 2-hydroxyethyl acryloyl phosphate. A preferable example of the structural unit C is a unit derived from at least one monomer selected from a group consisting of an alkyl acrylate having an alkyl group having 1 to 4 carbon atoms, an alkyl methacrylate having an alkyl group having 1 to 4 carbon atoms, and an acrylonitrile. A more preferable example thereof is a unit derived from at least one monomer selected from a group consisting of ethyl acrylate, butyl acrylate, and acrylonitrile. The acrylic polymer B preferably has, as structural units, all of a unit derived from ethyl acrylate, a unit derived from butyl acrylate, and a unit derived from acrylonitrile. In this case, the storage modulus $G'_B$ and the storage modulus $G'_A$ can be in the above ranges more reliably. It should be noted that the structural unit C has no thermosetting group.

A content of the structural unit C in the acrylic polymer B is, for example, 70 weight % or more, and may be 80 weight % or more, or even 90 weight % or more. The acrylic polymer B may be formed of the structural unit C.

When the acrylic polymer B has a unit (acrylonitrile unit) derived from acrylonitrile, the content of the unit in the acrylic polymer B is, for example, 5 weight % or more, and may be 10 weight % or more, 15 weight % or more, or even 20 weight % or more. The upper limit of the content of the unit is, for example, 40 weight % or less. In this case, the storage modulus $G'_B$ can be in the above range more reliably.

The acrylic polymer B may have a structural unit D having a thermosetting group. Examples of the structural unit D include a unit derived from alkyl acrylate in which a thermosetting group is introduced and a unit derived from alkyl methacrylate in which a thermosetting group is introduced. Specific examples of the thermosetting group, the alkyl acrylate, and the alkyl methacrylate are as described above. More specific examples of the structural unit D include glycidyl methyl acrylate, glycidyl ethyl acrylate, glycidyl 2-ethylhexyl acrylate, carboxymethyl acrylate, and aziridinyl methyl acrylate. The acrylic polymer B may not have the structural unit D; however, in that case, the composition A normally includes the thermosetting resin having the thermosetting group.

When the acrylic polymer B has the structural unit D, a content of the structural unit D in the acrylic polymer B is, for example, 30 to 95 weight %, and may be 40 to 90 weight %. In this case, the storage modulus $G'_B$ can be in the above range more reliably. Moreover, in this case, the content of the structural unit C may be out of the range shown above as examples, and the sum of the content of the structural unit C and the content of the structural unit D is, for example, 70 weight % or more, and may be 80 weight % or more, or even 90 weight % or more. The acrylic polymer B may be formed of the structural unit C and the structural unit D.

When the acrylic polymer B has the structural unit D having an epoxy group, an epoxy value of the acrylic polymer B is, for example, 0.15 to 0.65 eq/kg, and may be 0.20 to 0.50 eq/kg. In this case, the storage modulus $G'_B$ can be in the above range more reliably.

The acrylic polymer B can be formed by a known polymerization method such as solution polymerization, bulk polymerization, suspension polymerization, or emulsion polymerization.

The composition A may include a filler. Examples of the filler include an inorganic filler and an organic filler. An inorganic filler is preferred in terms of improvement of handleability of the composition A, adjustment of melt viscosity of the composition A, and provision of thixotropy to the composition A, etc.

Examples of the inorganic filler include silica, aluminum hydroxide, calcium hydroxide, magnesium hydroxide, antimony trioxide, calcium carbonate, magnesium carbonate, calcium silicate, magnesium silicate, calcium oxide, magnesium oxide, aluminum oxide, aluminum nitride, aluminum borate, and boron nitride. The silica may be crystalline silica or amorphous silica. Examples of the organic filler include polyimides, polyamide-imides, polyetheretherketone, polyetherimide, polyesterimide, nylon, and silicone.

The average particle diameter of the filler is, for example, 0.005 to 10 μm, and may be 0.05 to 1 μm. Different fillers having different average particle diameters may be combined. The average particle diameter of the filler can be determined using a photometric particle size distribution analyzer (for example, LA-910 (apparatus name) manufactured by HORIBA, LTD.).

Examples of the shape of the filler include a sphere and an ellipsoid.

The composition A may include an additional component other than those described above as long as the effect of the present invention is achieved. Examples of the additional component include additives such as a flame retardant, a silane coupling agent, an ion trapping agent, and a thermal curing accelerating catalyst.

Examples of the flame retardant include antimony trioxide, antimony pentoxide, and brominated epoxy resins. Examples of the silane coupling agent include β-(3,4-epoxycyclohexyl)ethyl trimethoxysilane, γ-glycidoxypropyl trimethoxysilane, and γ-glycidoxypropyl methyldiethoxysilane. Examples of the ion trapping agent include hydrotalcites and bismuth hydroxide. Examples of the thermal curing accelerating catalyst include salts having a triphenylphosphine skeleton, an amine skeleton, a triphenylborane skeleton, or a trihalogenborane skeleton.

The composition A is not limited to the above examples as long as the storage modulus $G'_B$ satisfies the above range.

The adhesive agent layer 3 and the thermosetting adhesive layer 11 of FIG. 1B are joined to the protective membrane 2. However, an additional layer may be placed between the adhesive agent layer 3 and the protective membrane 2 and/or between the thermosetting adhesive layer 11 and the protective membrane 2. Shrinking of the protective membrane 2 can influence even the additional layer included in the laminate 4. Therefore, even when the additional layer is placed between the adhesive agent layer 3 and the protective membrane 2 and/or between the thermosetting adhesive layer 11 and the protective membrane 2, the effects of the present invention can be achieved.

A shrinkage X of the protective cover member 1 in at least one in-plane direction may be 10% or less at 260° C. which corresponds to the temperature for a high-temperature treatment such as reflow soldering. The shrinkage X may be 9% or less, 8% or less, 7% or less, 6% or less, 5% or less, 4% or less, 3% or less, or even 2% or less. The lower limit of the shrinkage X is, for example, 0.01% or more. The thermosetting adhesive layer 11 may have a shrinkage X in the above range in at least two or more in-plane directions, and may have a shrinkage X in the above range in all in-plane directions. When including the protective membrane 2 in which an MD (a machine direction) and a TD (an in-plane direction perpendicular to the MD) can be defined, the protective cover member 1 may have a shrinkage X in the above range in the MD and/or the TD of the protective membrane 2. The protective membrane 2 in which the MD and the TD can be defined is, for example, a membrane including a stretched porous PTFE membrane. The MD of the stretched porous PTFE membrane is a direction in which the membrane is rolled when manufactured. When the protective membrane 2 is in the form of a strip, a longitudinal direction thereof can be defined as the MD, and a width direction thereof can be defined as the TD. The protective membrane 2 of the protective cover member 1 having a shrinkage X in the above range may include a stretched porous PTFE membrane.

Figure 2:
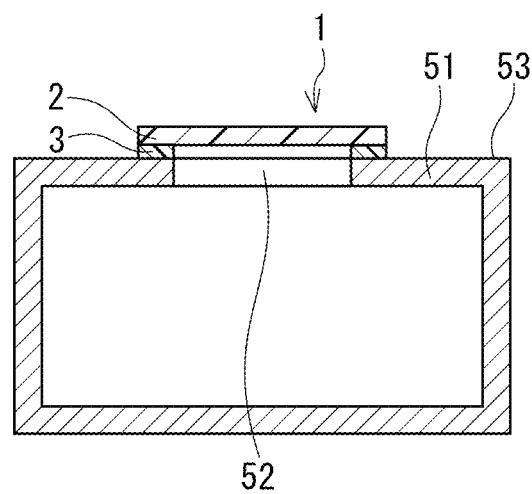
FIG. 2 is a schematic view showing an example of an embodiment of placement of the protective cover member of the present invention on an object.

FIG. 2 shows an example of an embodiment of placing the protective cover member 1 of FIGS. 1A and 1B on an object. In the example of FIG. 2, the protective cover member 1 is placed on a face 53 of an object 51, the face 53 having an opening 52. The protective cover member 1 is fixed to the face 53 with the adhesive agent layer 3 interposed therebetween. In this example, the adhesive agent layer 3 (the thermosetting adhesive layer 11) forms the joining surface 13 joined to the face 53 of the object 51.

Figure 3:
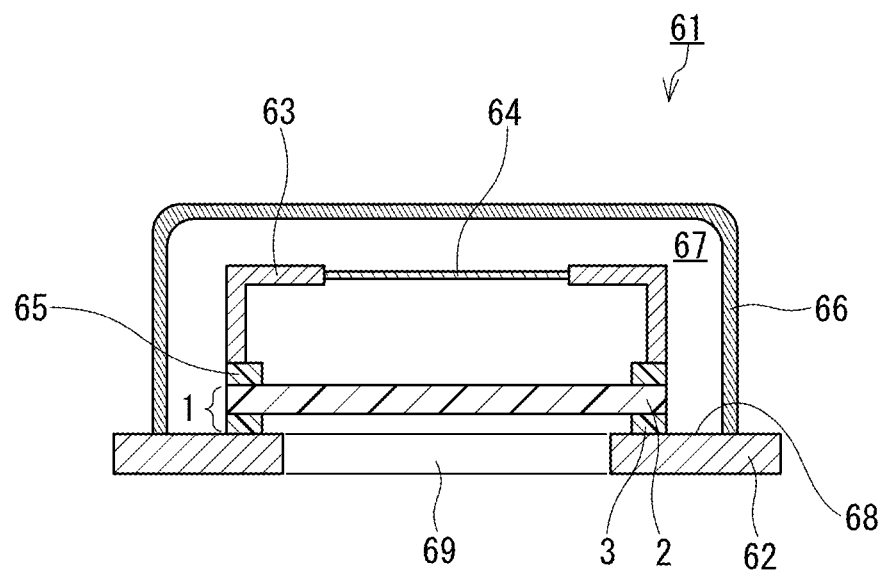
FIG. 3 is a schematic view showing an example of an embodiment of placement of the protective cover member of the present invention on an object.

The protective cover member 1 may be placed inside a semiconductor device such as a MEMS or inside a circuit board. FIG. 3 shows an example of placing the protective cover member 1 inside a MEMS. FIG. 3 shows an example of a MEMS including the protective member 1 of the present embodiment. A MEMS 61 of FIG. 3 is a bottom-port microphone element. The MEMS 61 includes a substrate 62 having an opening 69, a MEMS die 63 having a diaphragm 64, and a cap (cover) 66. The opening 69 functions as a sound-passing port. In an inside 67 of the MEMS 61, the protective cover member 1 is placed on an inner face 68 of the substrate 62 such that the protective membrane 2 covers the opening 69, the inner face 68 serving as a placement face. The protective cover member 1 is fixed to the inner face 68 with the adhesive agent layer 3 interposed therebetween. The MEMS die 63 is joined to the protective cover member 1, more specifically, to the protective membrane 2, with adhesive agent layer 65 interposed therebetween. The adhesive agent layer 65 is positioned opposite to the adhesive agent layer 3 with respect to the protective membrane 2 and is in contact with the protective membrane 2. Moreover, the adhesive agent layer 65 overlaps the adhesive agent layer 3 (in the example of FIG. 3, coincides with the adhesive agent layer 3) when viewed in a direction perpendicular to the principal surface of the protective membrane 2. The adhesive agent layer 65 may have the same configuration as that of the adhesive agent layer 3. The MEMS 61 can include an optional component other than those described above.

The adhesive agent layer 3 may have a laminate structure as long as including the thermosetting adhesive layer 11. The laminate structure may include two or more adhesive layers, and at least one adhesive layer selected from the two or more adhesive layers or every adhesive layer may be the thermosetting adhesive layer 11.

Figure 4:
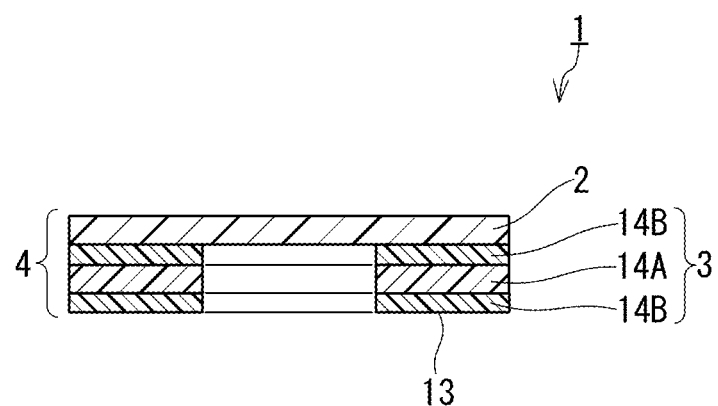
FIG. 4 is a cross-sectional view schematically showing an example of the protective cover member of the present invention.

The adhesive agent layer 3 may include a substrate and the thermosetting adhesive layer 11 placed on at least one surface of the substrate. FIG. 4 shows an example of such an embodiment. The adhesive agent layer 3 of FIG. 4 has a substrate 14A and two adhesive layers 14B each provided on a surface of the substrate 14A. One of the adhesive layers 14B is in contact with the protective membrane 2. The other adhesive layer 14B forms the joining surface 13 of the protective cover member 1. At least one selected from the two adhesive layers 14B is the thermosetting adhesive layer 11, and both of them may be the thermosetting adhesive layers 11. This embodiment in which the adhesive agent layer 3 includes the substrate 14A is particularly suitable for reducing deformation of the protective cover member 1 due to a high-temperature treatment and for reducing peeling of the protective cover member 1 from a placement face due to a high-temperature treatment.

The substrate 14A is, for example, a film, non-woven fabric, or foam made of a resin, metal, or composite material thereof. Examples of the resin include polyolefins such as polyethylene and polypropylene, polyesters such as polyethylene terephthalate (PET), silicone resins, polycarbonates, polyimides, polyamide-imides, polyphenylene sulfide, polyetheretherketone (PEEK), and fluorine resins. Examples of the fluorine resins include polytetrafluoroethylene (PTFE), tetrafluoroethylene-perfluoroalkyl vinyl ether copolymer (PFA), tetrafluoroethylene-hexafluoropropylene copolymer (FEP), and tetrafluoroethylene-ethylene copolymer (ETFE). Examples of the metal include stainless steel and aluminum. However, the resin and the metal are not limited to the above examples.

The substrate 14A may include a heat-resistant material. In this case, the protective cover member 1 can be used more reliably at high temperatures depending on the materials of the other layers of the protective cover member 1. Examples of the heat-resistant material include a metal and a heat-resistant resin. The heat-resistant resin typically has a melting point of 150° C. or higher. The heat-resistant resin may have a melting point of 160° C. or higher, 200° C. or higher, 220° C. or higher, 240° C. or higher, 250° C. or higher, 260° C. or higher, or even 300° C. or higher. Examples of the heat-resistant resin include a silicone resin, a polyimide, a polyamide-imide, polyphenylene sulfide, PEEK, and a fluorine resin. The fluorine resin may be PTFE. PTFE is excellent particularly in heat resistance.

The adhesive agent layer 3 of FIG. 1B is placed in a partial region of the protective membrane 2 when viewed in the direction perpendicular to the principal surface of the protective membrane 2. The adhesive agent layer 3 of FIG. 1B is in the shape of a peripheral portion of the protective membrane 2 when viewed in the above direction. More specifically, the adhesive agent layer 3 of FIG. 1B is in the shape of a frame when viewed in the above direction. In this case, more favorable passage of gas and/or sound can be achieved in a region P, where the adhesive agent layer 3 is not arranged, of the protective membrane 2 than in a region where the adhesive agent layer 3 is arranged. However, the shape of the adhesive agent layer 3 is not limited to the above example.

The region P of the protective membrane 2 has an area of, for example, 20 mm$^2$ or less. The protective cover member including the region P having an area in this range is, for example, suitable for being placed on a MEMS or circuit board that normally has a small-diameter opening. The lower limit of the area of the region P is, for example, 0.008 mm$^2$ or more. However, the area of the region P may be beyond the above range depending on the type of an object on which the protective cover member 1 is placed.

The thickness of the adhesive agent layer 3 is, for example, 10 to 200 μm, and may be 10 to 100 μm, 10 to 50 μm, or even 10 to 40 μm.

The protective membrane 2 may be gas-impermeable in a thickness direction thereof or may have gas permeability in the thickness direction. In the case where the protective membrane 2 has gas permeability in the thickness direction, placement of the protective cover member 1 allows, for example, passage of gas through an opening of an object while entrance of a foreign matter through the opening of the object is prevented. By allowing passage of gas, for example, adjustment of pressure and reduction of pressure variability can be achieved through the opening of the object. An example of reducing pressure variability is shown hereinafter. Sometimes, a heat treatment such as reflow soldering is performed with a semiconductor device placed to cover one opening of a through hole provided in a circuit board. With the protective cover member 1 placed to cover the other opening of the through hole, entrance of a foreign matter into the device through the through hole can be reduced in the heat treatment. When the protective membrane 2 has gas permeability in the thickness direction, a heat-induced increase in pressure in the through hole is reduced and damage to the device by the pressure increase can be prevented. Examples of the semiconductor device include MEMSs such as microphones, pressure sensors, and acceleration sensors. These devices have an opening allowing gas or sound to pass therethrough, and can be placed on a circuit board such that the opening faces a through hole provided in the circuit board. The protective cover member 1 may be placed on a manufactured semiconductor device such that the protective cover member 1 covers an opening of the manufactured semiconductor device. In the case where the protective membrane 2 has gas permeability in the thickness direction, the protective cover member 1 placed on an object can function, for example, as a gas-permeable member allowing passage of gas through an opening of the object while preventing entrance of a foreign matter through the opening and/or a sound-permeable member allowing passage of sound through an opening of the object while preventing entrance of a foreign matter through the opening. It should be noted that even in the case where the protective membrane 2 is gas-impermeable in the thickness direction, it is possible to transmit sound by vibration of the protective membrane 2, and therefore the protective cover member 1 placed on an object functions as a sound-permeable member.

The protective membrane 2 having gas permeability in the thickness direction has a gas permeability of, for example, 100 sec/100 mL or less as expressed in terms of a gas permeability (Gurley air permeability) obtained according to Method B (Gurley method) of gas permeability measurement specified in Japanese Industrial Standards (hereinafter referred to as "JIS") L 1096.

The protective membrane 2 may be waterproof. The protective cover member 1 including the protective membrane 2 being waterproof can function, for example, as a waterproof gas-permeable member and/or a waterproof sound-permeable member after placed on an object. The protective membrane 2 being waterproof has a water entry pressure of, for example, 5 kPa or more. The water entry pressure is determined according to Method A (low water pressure method) or Method B (high water pressure method) of the water resistance test specified in JIS L 1092.

Examples of the material forming the protective membrane 2 include a metal, a resin, and a composite material thereof.

Examples of the resin and metal that can form the protective membrane 2 are the same as the examples of the resin and metal that can form the substrate 14A. However, the resin and metal that can form the protective membrane 2 are not limited to the above examples.

The protective membrane 2 may be formed of a heat-resistant material. In this case, applicability of the protective cover member 1 to a treatment, such as reflow soldering, at high temperatures can be more reliably achieved depending on the materials of the other layers of the protective cover member 1. Examples of the heat-resistant material are as described above in the description of the substrate 14A. In one example, the protective membrane 2 may include a PTFE membrane.

The protective membrane 2 having gas permeability in the thickness direction may include a stretched porous membrane. The stretched porous membrane may be a stretched porous fluorine resin membrane, and particularly a stretched porous PTFE membrane. The stretched porous PTFE membrane is commonly formed by stretching a cast membrane or a paste extrusion containing PTFE particles. The stretched porous PTFE membrane is formed of fine PTFE fibrils and can have a node in which PTFE is more highly aggregated than in the fibrils. With the stretched porous PTFE membrane, it is possible to achieve both a high capability of preventing entrance of a foreign matter and a high gas permeability. A known stretched porous membrane can be used as the protective membrane 2.

The stretched porous membrane is likely to shrink at high temperatures. Therefore, when the protective membrane 2 includes the stretched porous membrane, the above effect, i.e., reducing deformation of the protective cover member 1 and peeling of the protective cover member 1 from a placement face due to a high-temperature treatment, is more advantageous. Additionally, when the protective membrane 2 includes the stretched porous membrane, the thermosetting adhesive layer 11 is preferably in contact with the protective membrane 2.

The protective membrane 2 having gas permeability in the thickness direction may include a perforated membrane in which a plurality of through holes connecting both principal surfaces of the membrane are formed. The perforated membrane may be a membrane formed by providing a plurality of through holes to an original membrane, such as an imperforate membrane, having a non-porous matrix structure. The perforated membrane may have no other ventilation paths in the thickness direction than the plurality of through holes. The through hole may extend in the thickness direction of the perforated membrane or may be a straight hole linearly extending in the thickness direction. An opening of the through hole may have the shape of a circle or an ellipse when viewed perpendicular to a principal surface of the perforated membrane. The perforated membrane can be formed, for example, by laser processing of the original membrane or by ion beam irradiation of the original membrane and subsequent perforation of the resulting membrane by chemical etching.

The protective membrane 2 having gas permeability in the thickness direction may include a non-woven fabric, a woven fabric, a mesh, or a net.

The protective membrane 2 is not limited to the above examples.

The protective membrane 2 of FIG. 1B has the shape of a rectangle when viewed in the direction perpendicular to the principal surface of the protective membrane 2. However, the shape of the protective membrane 2 is not limited to the above example, and may be, for example, a polygon such as a square or a rectangle, a circle, or an ellipse when viewed in the above direction. The polygon may be a regular polygon. A corner of the polygon may be rounded.

The thickness of the protective membrane 2 is, for example, 1 to 100 μm.

The protective membrane 2 has an area of, for example, 175 mm$^2$ or less, and may have an area of 150 mm$^2$ or less, 125 mm$^2$ or less, 100 mm$^2$ or less, 75 mm$^2$ or less, 50 mm$^2$ or less, 25 mm$^2$ or less, 20 mm$^2$ or less, 15 mm$^2$ or less, 10 mm$^2$ or less, or even 7.5 mm$^2$ or less. The protective cover member 1 including the protective membrane 2 having an area in the above range is, for example, suitable for being placed on a circuit board or MEMS that normally has a small-diameter opening. The lower limit of the area of the protective membrane 2 is, for example, 0.20 mm$^2$ or more. However, the area of the protective membrane 2 may be beyond the above range depending on the type of an object on which the protective cover member 1 is placed.

The adhesive agent layer 3 of FIG. 1B is placed in the peripheral portion of the protective membrane 2 when viewed in the direction perpendicular to the principal surface of the protective membrane 2. In this case, when viewed perpendicular to the principal surface of the protective membrane 2, a ratio $L_2/L_1$ may be 0.5 or less, 0.3 or less, 0.2 or less, or even 0.1 or less, where $L_1$ is a length of a shortest line segment $S_{min}$ of line segments extending from a center of the protective membrane 2 to a perimeter of the protective membrane 2, and $L_2$ is a length of a portion of the shortest line segment $S_{min}$, the portion lying over the adhesive agent layer 3. The lower limit of the ratio $L_2/L_1$ is, for example, 0.05 or more. The lower the ratio $L_2/L_1$ is, the more difficult it is to reduce the influence of shrinking of the protective membrane 2 on the protective cover member 1. Therefore, when the ratio $L_2/L_1$ is in the above range, the above effect, i.e., reducing deformation of the protective cover member 1 and peeling of the protective cover member 1 from a placement face due to a high-temperature treatment, is more advantageous. The center O of the protective membrane 2 can be determined as a center of gravity of the shape of the protective membrane 2, the shape being defined when viewed in the direction perpendicular to the principal surface of the protective membrane 2.

Figure 5:
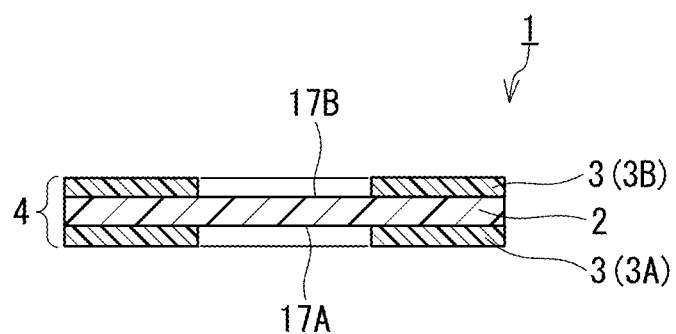
FIG. 5 is a cross-sectional view schematically showing an example of the protective cover member of the present invention.

The laminate 4 may include a first adhesive agent layer positioned on a first principal surface side of the protective membrane 2 and a second adhesive agent layer positioned on a second principal surface side of the protective membrane 2. In this case, for example, the laminate 4 can be placed on a face of an object owing to at least one adhesive agent layer selected from the first and the second adhesive agent layers, and it is possible to place an additional layer on the other adhesive agent layer or to join the other adhesive agent layer to, for example, an optional member and/or surface. At least one adhesive agent layer selected from the first and the second adhesive agent layers may be the adhesive agent layer 3 including the thermosetting adhesive layer 11. As shown in FIG. 5, the first adhesive agent layer positioned on a first principal surface 17A side of the protective membrane 2 and the second adhesive agent layer positioned on a second principal surface 17B side of the protective membrane 2 each may be the adhesive agent layer 3 (3A or 3B) including the thermosetting adhesive layer 11. When the first and second adhesive agent layers are each the adhesive agent layer 3, the above effect, i.e., reducing deformation of the protective cover member 1 and peeling of the protective cover member 1 from a placement face due to a high-temperature treatment, is more reliably achieved.

The shape of the adhesive agent layer 3B of FIG. 5 is the same as that of the adhesive agent layer 3A when viewed in the direction perpendicular to the principal surface of the protective membrane 2. The adhesive agent layer 3B may have a different shape from that of the adhesive agent layer 3A when viewed in the above direction.

Figure 6:
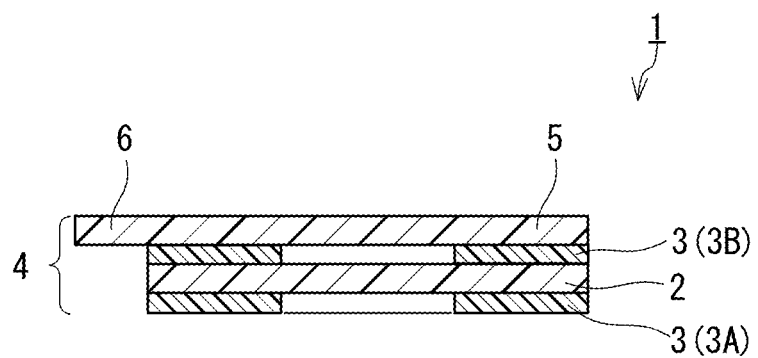
FIG. 6 is a cross-sectional view schematically showing an example of the protective cover member of the present invention.

The laminate 4 included in the protective cover member 1 may include a layer other than the protective membrane 2 and the adhesive agent layer 3. FIG. 6 shows an example of the protective cover member 1 including an additional layer.

The laminate 4 of FIG. 6 is the same as the laminate 4 of FIG. 5, except that the laminate 4 of FIG. 6 further includes a cover film 5 covering the protective membrane 2 on the second principal surface 17B side (the adhesive agent layer 3B side) of the protective membrane 2. The cover film 5 is placed on the adhesive agent layer 3B. An additional layer may be placed between the adhesive agent layer 3B and the cover film 5. The cover film 5 functions as a protective film protecting the protective membrane 2 until the protective cover member 1 is placed on an object, for example. The cover film 5 may be peeled off after the protective cover member 1 is placed on an object. The cover film 5 may cover the entire protective membrane 2 or may cover a part of the protective membrane 2 when viewed in the direction perpendicular to the principal surface of the protective membrane 2.

The cover film 5 of FIG. 6 has a tab 6 protruding outward more than the perimeter of the protective membrane 2 when viewed in the direction perpendicular to the principal surface of the protective membrane 2. The tab 6 can be used to peel the cover film 5 off. However, the shape of the cover film 5 is not limited to the above examples.

Examples of the material forming the cover film 5 include a metal, a resin, and a composite material thereof. Specific examples of the material that can form the cover film 5 are the same as the specific examples of the material that can form the substrate 14A.

The thickness of the cover film 5 is, for example, 200 to 1000 μm.

The protective cover member 1 of FIGS. 1A and 1B has the shape of a rectangle when viewed in the direction perpendicular to the principal surface of the protective membrane 2. However, the shape of the protective cover member 1 is not limited to the above example. The shape thereof may be a polygon including a square and a rectangle, a circle, and an ellipse when viewed in the above direction. The polygon may be a regular polygon. A corner of the polygon may be rounded.

The area of the protective cover member 1 (the area defined when the member 1 is viewed in the direction perpendicular to the principal surface of the protective membrane 2) is, for example, 175 mm$^2$ or less, and may be 150 mm$^2$ or less, 125 mm$^2$ or less, 100 mm$^2$ or less, 75 mm$^2$ or less, 50 mm$^2$ or less, 25 mm$^2$ or less, 20 mm$^2$ or less, 15 mm$^2$ or less, 10 mm$^2$ or less, or even 7.5 mm$^2$ or less. The protective cover member 1 having an area in the above range is, for example, suitable for being placed on a circuit board or MEMS that normally has a small-diameter opening. The lower limit of the area of the protective cover member 1 is, for example, 0.20 mm$^2$ or more. However, the area of the protective cover member 1 may be larger depending on the type of an object on which the protective cover member 1 is placed. It should be noted that the smaller the area of the protective cover member 1 is, the more likely deformation thereof and peeling thereof from a placement face due to a high-temperature treatment are to happen. Therefore, when the protective cover member 1 has an area in the above range, the above effect, i.e., reducing deformation thereof and peeling thereof from a placement face due to a high-temperature treatment, is particularly advantageous.

Examples of an object on which the protective cover member 1 is placed include semiconductor devices, such as MEMSs, and circuit boards. In other words, the protective cover member 1 may be a member for a semiconductor device, circuit board, or MEMS and may be configured to be placed on an object which is a semiconductor device, circuit board, or MEMS. The MEMS may be a non-encapsulated device having a ventilation hole on a surface of its package. Examples of the non-encapsulated MEMS include various sensors detecting the atmospheric pressure, humidity, gas, air flow, and the like and electroacoustic transducer elements such as speakers and microphones. Moreover, examples of the object are not limited to manufactured semiconductor devices and manufactured circuit boards, and may be intermediate products of such devices or boards in a manufacturing step. In this case, the protective cover member 1 can protect the intermediate product in the manufacturing step. Examples of the manufacturing step include a reflow soldering step, dicing step, bonding step, and mounting step. The manufacturing step may be a step, such as the reflow soldering step, performed at high temperatures. The term "high temperatures" as used herein is, for example, 200° C. or higher, and may be 220° C. or higher, 240° C. or higher, or even 260° C. or higher. The reflow soldering step is normally performed at about 260° C. However, the object is not limited to the above examples.

A face of an object on which the protective cover member 1 can be placed is typically an outer surface of the object. The face may be a face inside the object. The face may be a flat face or a curved face. An opening of the object may be an opening of a recessed portion or an opening of a through hole.

The protective cover member 1 can be manufactured, for example, by placing the composition A in a given pattern on a principal surface of the protective membrane 2 and drying the placed composition A to form the adhesive agent layer 3.

According to the studies by the present inventors, when the content of the acrylic polymer having a weight-average molecular weight of 200,000 or more is 35 weight % or more in the composition A, the storage modulus $G'_B$ in the above range can be more reliably achieved. In this aspect, the present invention provides a protective cover member (second protective cover member) configured to be placed on a face of an object, the face having an opening, the protective cover member including a laminate, wherein the laminate includes: a protective membrane having a shape configured to cover the opening when the member is placed on the face; and an adhesive agent layer, the adhesive agent layer includes a thermosetting adhesive layer including a thermosetting resin composition, the thermosetting resin composition includes an acrylic polymer having a weight-average molecular weight of 200,000 or more, and a content of the acrylic polymer in the thermosetting resin composition is 35 weight % or more.

The second protective cover member can have the same configuration as that of the above-described protective cover member 1 including its preferred embodiments. Additionally, as long as the thermosetting resin composition of the second protective cover member includes 35 weight % or more of the acrylic polymer having a weight-average molecular weight of 200,000 or more, the thermosetting resin composition of the second protective cover member can have the same configuration as that of the composition A, including its preferred embodiments, of the above-described protective cover member 1.

By leaving the protective cover member 1 at high temperatures, the thermosetting adhesive layer 11 is thermally cured to turn into the cured adhesive layer of the composition A. In this aspect, the present invention provides a protective cover member (third protective cover member) configured to be placed on a face of an object, the face having an opening, the protective cover member including a laminate, wherein
the laminate includes: a protective membrane having a shape configured to cover the opening when the member is placed on the face; and an adhesive agent layer, the adhesive agent layer includes a cured adhesive layer formed of the thermosetting resin composition A, and the thermosetting resin composition has a storage modulus of $1 \times 10^5$ Pa or more at 130 to 170° C.

The second protective cover member and the third protective cover member each may be a member configured to be placed on a face of an object to prevent entrance of a foreign matter into an opening of the face.

The cured adhesive layer normally has a higher adhesiveness than that of the thermosetting adhesive layer 11. The thermosetting adhesive layer 11 has a thermal curing temperature of, for example, 130 to 170° C. Before or after thermal curing of the thermosetting adhesive layer 11, the protective cover member 1 and an object on which the protective cover member 1 is placed may be subjected to a step, such as a reflow soldering step, performed at high temperatures. In the case where the object is subjected to the above step before thermal curing, the cured adhesive layer is formed as the step progresses, and a flow of the adhesive agent layer 3 is reduced in the step.

[Member Supplying Sheet]

Figure 7:
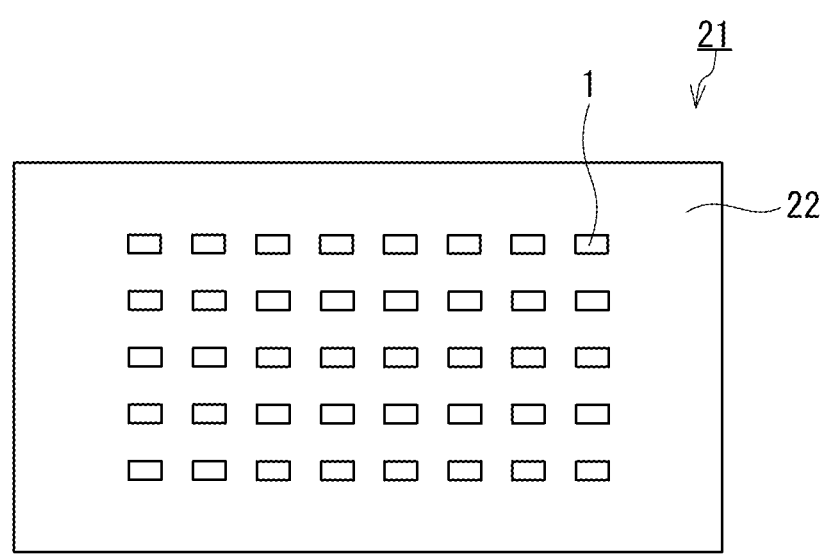
FIG. 7 is a plan view schematically showing an example of a member supplying sheet of the present invention.

FIG. 7 shows an example of a member supplying sheet of the present invention. A member supplying sheet 21 shown in FIG. 7 includes a substrate sheet 22 and two or more protective cover members 1 placed on the substrate sheet 22. The member supplying sheet 21 is a sheet for supplying the protective cover member 1. With the use of the member supplying sheet 21, the protective cover member 1 can be effectively supplied, for example, in a step of placing the member 1 on a face of an object.

In the example shown in FIG. 7, two or more protective cover members 1 are placed on the substrate sheet 22. The number of the protective cover members 1 placed on the substrate sheet 22 may be one.

In the example shown in FIG. 7, two or more protective cover members 1 are regularly placed on the substrate sheet 22. More specifically, when viewed perpendicular to the surface of the substrate sheet 22, the protective cover members 1 are placed such that a center of each protective cover member 1 is at an intersection (lattice point) of a rectangular lattice. However, the arrangement of the regularly placed protective cover members 1 is not limited to the above examples. The protective cover members 1 may be regularly placed such that the center of each protective cover member 1 is at an intersection of any of various lattices such as a square lattice, an orthorhombic lattice, or a rhombic lattice. However, the embodiment of placing the protective cover members 1 is not limited to the above example. For example, the protective cover members 1 may be placed in a staggered pattern when viewed perpendicular to the surface of the substrate sheet 22. The center of the protective cover member 1 can be determined as a center of gravity of the shape of the member 1, the shape being defined when viewed in a direction perpendicular to the surface of the substrate sheet 22.

Examples of the material forming the substrate sheet 22 include paper, a metal, a resin, and a composite material thereof. Examples of the metal include aluminum and stainless steel. Examples of the resin include a polyester such as PET and a polyolefin such as polyethylene and polypropylene. However, the material forming the substrate sheet 22 is not limited to the above examples.

The protective cover member 1 may be placed on the substrate sheet 22 via an adhesive layer (for example, the adhesive agent layer 3) of the member 1. In this case, a placement face of the substrate sheet 22 on which the member 1 is placed may have been subjected to release treatment for improving ease of release of the member 1 from the substrate sheet 22. The release treatment can be performed by a known technique.

The protective cover member 1 may be placed on the substrate sheet 22 via an adhesive layer, typically a low-adhesive layer, being provided on the placement face of the substrate sheet 22 on which the protective cover member 1 is placed.

The thickness of the substrate sheet 22 is, for example, 1 to 200 μm.

The substrate sheet 22 of FIG. 7 is in the form of a sheet having a rectangular shape. The shape of the substrate sheet 22 in the form of a sheet is not limited to the above example, and may be a polygon such as a square or a rectangle, a circle, an ellipse, or the like. When the substrate sheet 22 is in the form of a sheet, the member supplying sheet 21 can be distributed and used in the form of a sheet. The substrate sheet 22 may be in the form of a strip. In this case, the member supplying sheet 21 is also in the form of a strip. The member supplying sheet 21 in the form of a strip can be distributed in the form of a wound body wound around a winding core.

The member supplying sheet 21 can be manufactured by placing the protective cover member 1 on a surface of the substrate sheet 22.

EXAMPLES

Hereinafter, the present invention will be described more specifically by way of examples. The present invention is not limited to examples shown below.

First, evaluation methods will be described.

[Weight-Average Molecular Weight]

The weight-average molecular weights of acrylic polymers were evaluated by gel permeation chromatography (GPC). Four columns, which were TSK G2000H HR, G3000H HR, G4000H HR, and GMH-H HR (all manufactured by Tosoh Corporation), were connected in series and tetrahydrofuran was used as an eluent to perform GPC under the following conditions: flow rate: 1 mL/min; temperature: 40° C.; sample concentration: 0.1 weight %; amount of the tetrahydrofuran solution and the sample introduced: 500 μL. Additionally, a detector used was a differential refractometer.

[Glass Transition Temperature (Tg)]

The Tg of each acrylic polymer was calculated using a viscoelastic analyzer (RSA-III manufactured by Rheometric Scientific Inc.) from a peak of tan δ (=loss modulus/storage modulus) evaluated under the following measurement conditions: temperature increase rate: 10° C./min; frequency: 1 MHz.

[Epoxy Value]

The epoxy value of each acrylic polymer was evaluated according to the standards specified in JIS K 7236. The details are as follows. An amount of 4 g of an acrylic polymer to be evaluated was weighed into a conical flask having a capacity of 100 mL, to which 10 mL of chloroform was added to dissolve the acrylic polymer. Then, 30 mL of acetic acid, 5 mL of tetraethylammonium bromide, and 5 drops of a crystal violet indicator were added, and were titrated with a perchloric acid-acetic acid normal solution having a concentration of 0.1 mol/L under stirring with a magnetic stirrer. A blank test was performed in the same manner, and the epoxy value was calculated by the following equation.

$$\text{epoxy value} = [(V - V_B) \times 0.1 \times F]/4(g) \qquad \text{Equation:}$$

$V_B$: the volume (mL) of the perchloric acid-acetic acid normal solution in the blank test V: the volume (mL) of the perchloric acid-acetic acid normal solution in the titration of the specimen F: a factor of the perchloric acid-acetic acid normal solution

[Storage Modulus $G'_B$ at 130 to 170° C.]

The storage modulus $G'_B$ at 130 to 170° C. was evaluated for thermosetting resin compositions in the following manner. First, each thermosetting resin composition was applied to a surface, which had been subjected to a release treatment with silicone, of a PET sheet (thickness: 50 μm) to form a coating film (thickness: 25 μm). The coating film was dried to form a film by heating at 130° C. for a short period of time (2 minutes), which are conditions under which thermal curing of the composition hardly progresses. Next, the obtained film was peeled from the PET film and was then cut into a test piece having a length of 22.5 mm and a width of 10 mm. Subsequently, the storage modulus $G'_B$ at 130 to 170° C. was evaluated by heating the test piece from 0° C. to 260° C. at a temperature increase rate of 10° C./min using a forced vibration viscoelastic analyzer (RSA-III manufactured by Rheometric Scientific Inc.) for solids. The direction of measurement (direction of vibration) of the test piece was a longitudinal direction of the test piece, and the vibration frequency was 1 Hz.

[Storage Modulus $G'_A$ at 250° C. after Thermal Curing]

The storage modulus $G'_A$ at 250° C. after thermal curing was evaluated for the thermosetting resin compositions in the following manner. First, as in the evaluation of the storage modulus $G'_B$, a coating film of each thermosetting resin composition was formed on a PET film. Next, the coating film was turned into a cured film by curing at 170° C. and for 60 minutes, which are conditions under which thermal curing of the composition progresses. The obtained cured film was peeled from the PET film and was then cut into a test piece having a length of 22.5 mm and a width of 10 mm. Subsequently, the storage modulus $G'_A$ at 250° C. was evaluated by heating the test piece from 0° C. to 260° C. at a temperature increase rate of 10° C./min using the above-described viscoelastic analyzer for solids. The direction of measurement (direction of vibration) of the test piece was a longitudinal direction of the test piece, and the vibration frequency was 1 Hz.

[Shrinkage X at 260° C.]

The shrinkages X at 260° C. of protective cover members were evaluated in the following manner. Protective cover members (in the shape of a square 1.7 mm on a side having a four-layered structure composed of "adhesive agent layer/polyimide substrate (thickness: 25 μm)/adhesive agent layer/stretched porous PTFE membrane") produced in Examples and Comparative Examples were each subjected to a heating treatment in which the protective cover member was maintained in a heating bath maintained at 260° C. for 1 minute. The heating treatment was performed in a state where the protective cover member was adhered to a surface of a 2 mm thick stainless steel plate. The adhesion was performed such that the exposed adhesive agent layer was in contact with the stainless steel plate. To reliably adhere the protective cover member, the adhesion was performed by applying 0.3 MPa of a pressing force to the protective cover member for 1 second toward the above surface in an atmosphere, including the temperature of the stainless steel plate, maintained at 130° C. After the treatment, the protective cover member was left to cool to 25° C. Then, a minimum dimension $D_{min}$ of the protective cover member was measured in both the MD and the TD of the stretched porous PTFE membrane. The measurement was performed in a state where the protective cover member was adhered to the surface of the stainless steel plate. The shrinkage X (%) was calculated from the determined $D_{min}$ by the following equation: shrinkage $X = (1.7 - D_{min})/1.7 \times 100(\%)$. The minimum dimension $D_{min}$ was determined by image analysis of an enlarged image (at a magnification of 47 times) obtained using an optical microscope. The measurement of the minimum dimension $D_{min}$ was performed at a temperature of 25° C. and a relative humidity of 50%.

Example 1

An amount of 100 parts by weight of butyl acrylate-ethyl acrylate-acrylonitrile-glycidyl methyl acrylate copolymer (manufactured by Negami Chemical Industrial Co., Ltd.; weight-average molecular weight: 800,000; epoxy value: 0.4 eq/kg; Tg: 0° C.) as the acrylic polymer B and 11.1 parts by weight of a phenolic resin (MEH7851SS manufactured by Meiwa Plastic Industries, Ltd.) as a thermosetting resin were dissolved in methyl ethyl ketone, and 80.5 parts by weight of spherical silica (SE2050 manufactured by Admatechs Company Limited) having an average particle diameter of 500 nm was further dispersed therein. A thermosetting resin composition having a concentration of 23.6 weight % was thus prepared. The contents of the acrylic polymer B, the phenolic resin, and the silica in the thus-prepared composition were respectively 52 weight %, 6 weight %, and 42 weight %.

Next, the prepared composition was applied to both principal surfaces of a polyimide substrate (a square 1.7 mm on a side; thickness: 25 μm) to prepare a coating film over each of the entire principal surfaces. The coating films were then dried by heating at 130° C. for 2 minutes. After that, a stretched porous PTFE membrane (NTF663AP manufactured by Nitto Denko Corporation; a square 1.7 mm on a side) was joined to one of the dried coating films. The porous PTFE membrane was prepared such that the MD or the TD of the membrane and a direction in which one side of the membrane extended were the same. The stretched porous PTFE membrane was joined such that an perimeter of the membrane and perimeters of the coating films were aligned. The thickness of each thermosetting adhesive layer formed by the drying was 25 μm. A protective cover member of Example 1 was thus obtained.

Example 2

A thermosetting resin composition having a concentration of 23.6 weight % was prepared in the same manner as in Example 1, except that the silica was not added. The contents of the acrylic polymer B and the phenolic resin in the thus-prepared composition were respectively 90 weight % and 10 weight %. Next, a protective cover member of Example 2 was obtained in the same manner as in Example 1, except that the thus-prepared composition was used. The thickness of each thermosetting adhesive layer formed by the drying was 30 μm.

Example 3

A thermosetting resin composition having a concentration of 23.6 weight % was prepared in the same manner as in Example 1, except that butyl acrylate-ethyl acrylate-acrylonitrile-glycidyl methyl acrylate copolymer (manufactured by Negami Chemical Industrial Co., Ltd.; weight-average molecular weight: 800,000; epoxy value: 0.4 eq/kg; Tg: 15° C.) was used as the acrylic polymer B and that the materials were mixed so that the contents of the acrylic polymer B, the phenolic resin, and the silica in the resulting composition would be respectively 41 weight %, 17 weight %, and 42 weight %. Next, a protective cover member of Example 3 was obtained in the same manner as in Example 1, except that the thus-prepared composition was used. The thickness of each thermosetting adhesive layer formed by the drying was 20 μm.

Example 4

A thermosetting resin composition having a concentration of 23.6 weight % was prepared in the same manner as in Example 1, except that butyl acrylate-ethyl acrylate-acrylonitrile-glycidyl methyl acrylate copolymer (manufactured by Negami Chemical Industrial Co., Ltd.; weight-average molecular weight: 1,200,000; epoxy value: 0.4 eq/kg; Tg: 0° C.) was used as the acrylic polymer B and that the materials were mixed so that the contents of the acrylic polymer B, the phenolic resin, and the silica in the resulting composition would be respectively 60 weight %, 15 weight %, and 25 weight %. Next, a protective cover member of Example 4 was obtained in the same manner as in Example 1, except that the thus-prepared composition was used. The thickness of each thermosetting adhesive layer formed by the drying was 30 μm.

Comparative Example 1

A thermosetting resin composition having a concentration of 23.6 weight % was prepared in the same manner as in Example 1, except that butyl acrylate-ethyl acrylate-acrylonitrile-acrylic acid copolymer (manufactured by Negami Chemical Industrial Co., Ltd.; weight-average molecular weight: 800,000; acid value: 5 mgKOH/g; Tg: −15° C.) was used as an acrylic polymer, that an epoxy resin (a mixture containing YL980 manufactured by Mitsubishi Chemical Corporation and N-665-EXP-S manufactured by DIC Corporation at a weight ratio of 1:1) was further added, and that the materials were mixed so that the contents of the acrylic polymer, the phenolic resin, the epoxy resin, and the silica in the resulting composition would be respectively 9 weight %, 26 weight %, 25 weight %, and 40 weight %. Next, a protective cover member of Comparative Example 1 was obtained in the same manner as in Example 1, except that the thus-prepared composition was used. The thickness of each thermosetting adhesive layer formed by the drying was 25 μm.

Comparative Example 2

A thermosetting resin composition having a concentration of 23.6 weight % was prepared in the same manner as in Comparative Example 1, except that butyl acrylate-ethyl acrylate-acrylonitrile-acrylic acid copolymer (manufactured by Negami Chemical Industrial Co., Ltd.; weight-average molecular weight: 150,000; acid value: 5 mgKOH/g; Tg: 15° C.) as an acrylic polymer, LVR manufactured by Gun Ei Chemical Industry Co., Ltd. as an phenolic resin, EPPN501 HY manufactured by Nippon Kayaku Co., Ltd. as an epoxy resin were used and that the materials were mixed so that the contents of the acrylic polymer, the phenolic resin, the epoxy resin, and the silica in the resulting composition would be respectively 29 weight %, 11 weight %, 12 weight %, and 48 weight %. Next, a protective cover member of Comparative Example 2 was obtained in the same manner as in Example 1, except that the thus-prepared composition was used. The thickness of each thermosetting adhesive layer formed by the drying was 20 μm.

Comparative Example 3

A thermosetting resin composition having a concentration of 23.6 weight % was prepared in the same manner as in Comparative Example 1, except that the materials were mixed so that the contents of the acrylic polymer, the phenolic resin, the epoxy resin, and the silica in the resulting composition would be respectively 18 weight %, 21 weight %, 21 weight %, and 40 weight %. Next, a protective cover member of Comparative Example 3 was obtained in the same manner as in Example 1, except that the thus-prepared composition was used. The thickness of each thermosetting adhesive layer formed by the drying was 25 μm.

Comparative Example 4

A thermosetting resin composition having a concentration of 23.6 weight % was prepared in the same manner as in Comparative Example 1, except that butyl acrylate-ethyl acrylate-acrylonitrile-acrylic acid copolymer (manufactured by Negami Chemical Industrial Co., Ltd.; weight-average molecular weight: 400,000; acid value: 5 mgKOH/g; Tg: −15° C.) as an acrylic polymer, MEH7800H manufactured by Meiwa Plastic Industries, Ltd. as a phenolic resin were used and that the materials were mixed so that the contents of the acrylic polymer, the phenolic resin, the epoxy resin, and the silica in the resulting composition would be respectively 11 weight %, 32 weight %, 32 weight %, and 25 weight %. Next, a protective cover member of Comparative Example 4 was obtained in the same manner as in Example 1, except that the thus-prepared composition was used. The thickness of each thermosetting adhesive layer formed by the drying was 20 μm.

Comparative Example 5

A protective cover member of Comparative Example 5 was obtained in the same manner as in Example 1, except that an acrylic adhesive agent composition (No. 5919 manufactured by Nitto Denko Corporation) that is a non-curable pressure-sensitive adhesive agent was used instead of the thermosetting resin composition. It should be noted that instead of the drying after the application of the composition, the coating films were dried by heating at 120° C. for 3 minutes. The thickness of each adhesive agent layer formed by the drying was 50 μm. The storage modulus of an adhesive agent layer formed of the composition was evaluated only at 250° C.

Comparative Example 6

A protective cover member of Comparative Example 6 was obtained in the same manner as in Example 1, except that an acrylic adhesive agent composition (WR9203 manufactured by Nitto Denko Corporation) that is a non-curable pressure-sensitive adhesive agent was used instead of the thermosetting resin composition. It should be noted that instead of the drying after the application of the composition, the coating films were dried by heating at 120° C. for 3 minutes. The thickness of each adhesive agent layer formed by the drying was 30 μm. The storage modulus of an adhesive agent layer formed of the composition was evaluated only at 250° C.

Figure 8:
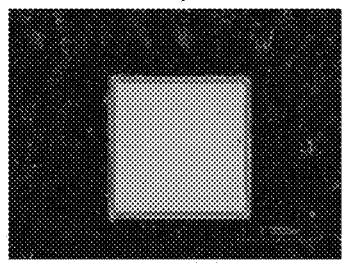
FIG. 8 shows the appearances of samples of Examples and Comparative Examples having undergone a heating treatment performed in EXAMPLES.
Figure 8:
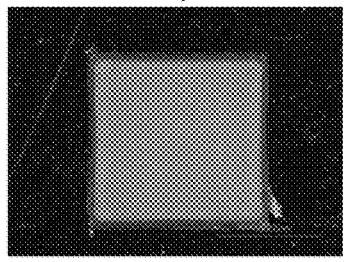
Figure 8:
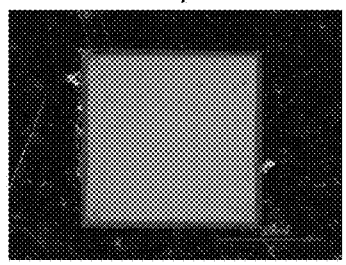
Figure 8:
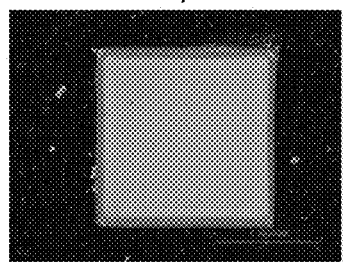
Figure 8:
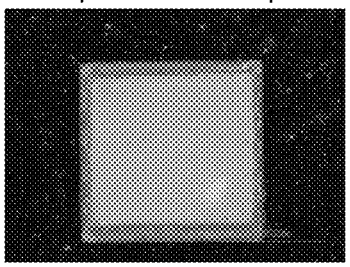
Figure 8:
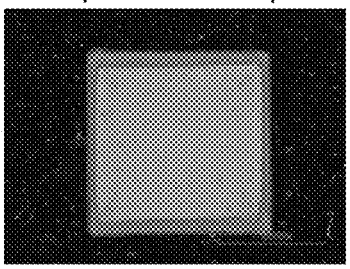
Figure 8:
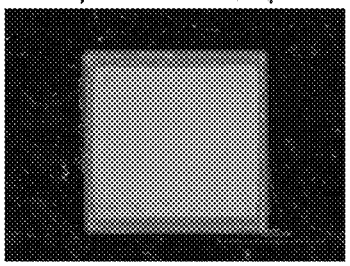
Figure 8:
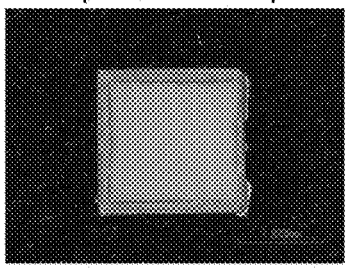
Figure 8:
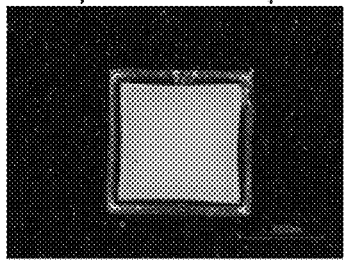
Figure 8:
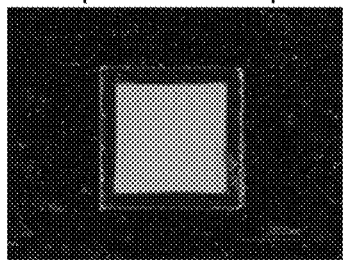

Tables 1 and 2 below show constitutions of the thermosetting resin compositions of Examples 1 to 4 and Comparative Examples 1 to 4, respectively. In Tables 1 and 2, "BA", "EA", "AN", "GMA", and "AA" in the row for the constitutions of the acrylic polymers respectively represent butyl acrylate, ethyl acrylate, acrylonitrile, glycidyl methyl acrylate, and acrylic acid. Moreover, Table 3 below shows the evaluation results of the thermosetting resin compositions, the acrylic adhesive agent compositions, and the protective cover members of Examples and Comparative Examples. Furthermore, FIG. 8 shows the appearances of the protective cover members of Examples and Comparative Examples having undergone the heating treatment (at 260° C. for 1 minute) performed to evaluate the shrinkage X.

TABLE 1

|  |  | Example 1 | Example 2 | Example 3 | Example 4 |
|---|---|---|---|---|---|
| Acrylic polymer | Constitution | BA/EA/AN/GMA | BA/EA/AN/GMA | BA/EA/AN/GMA | BA/EA/AN/GMA |
|  | Epoxy value (eq/kg) | 0.4 | 0.4 | 0.4 | 0.4 |
|  | Acid value (mgKOH/g) | — | — | — | — |
|  | Weight-average molecular weight | 800,000 | 800,000 | 800,000 | 1,200,000 |
|  | Tg (° C.) | 0 | 0 | 15 | 0 |
| Phenolic resin |  | MEH7851SS | MEH7851SS | MEH7851SS | MEH7851SS |
| Epoxy resin |  | — | — | — | — |
| Silica particles |  | SE2050 | — | SE2050 | SE2050 |
| Content (weight %) | Acrylic polymer | 52 | 90 | 41 | 60 |
|  | Phenolic resin | 6 | 10 | 17 | 15 |
|  | Epoxy resin | 0 | 0 | 0 | 0 |
|  | Silica | 42 | 0 | 42 | 25 |

TABLE 2

|  |  | Comparative Example 1 | Comparative Example 2 | Comparative Example 3 | Comparative Example 4 |
|---|---|---|---|---|---|
| Acrylic polymer | Constitution | BA/EA/AN/AA | BA/EA/AN/AA | BA/EA/AN/AA | BA/EA/AN/AA |
|  | Epoxy value (eq/kg) | — | — | — | — |
|  | Acid value (mgKOH/g) | 5 | 5 | 5 | 30 |
|  | Weight-average molecular weight | 800,000 | 150,000 | 800,000 | 400,000 |
|  | Tg (° C.) | −15 | 15 | −15 | −15 |
| Phenolic resin |  | MEH7851SS | LVR | MEH7851SS | MEH7800H |
| Epoxy resin |  | YL980 N-665-EXP-S | EPPN501HY | YL980 N-665-EXP-S | YL980 N-665-EXP-S |
| Silica particles |  | SE2050 | SE2050 | SE2050 | SE2050 |
| Content (weight %) | Acrylic polymer | 9 | 29 | 18 | 11 |
|  | Phenolic resin | 26 | 11 | 21 | 32 |
|  | Epoxy resin | 25 | 12 | 21 | 32 |
|  | Silica | 40 | 48 | 40 | 25 |

TABLE 3

|  | Thickness (μm) | Storage modulus (Pa) $G'_B$ | Storage modulus (Pa) $G'_A$ | Shrinkage X (%) MD | Shrinkage X (%) TD |
|---|---|---|---|---|---|
| Example 1 | 25 | $4.8 \times 10^5$ or more | $11.0 \times 10^5$ | 6 | 5 |
| Example 2 | 30 | $2.9 \times 10^5$ or more | $5.5 \times 10^5$ | 5 | 3 |
| Example 3 | 20 | $5.9 \times 10^5$ or more | $28.0 \times 10^5$ | 4 | 2 |
| Example 4 | 30 | $3.4 \times 10^5$ or more | $11.0 \times 10^5$ | 7 | 6 |
| Comparative Example 1 | 25 | Less than $1.0 \times 10^5$ | $200 \times 10^5$ | 13 | 9 |
| Comparative Example 2 | 20 | Less than $1.0 \times 10^5$ | $1000 \times 10^5$ | 11 | 5 |
| Comparative Example 3 | 25 | Less than $1.0 \times 10^5$ | $300 \times 10^5$ | 12 | 6 |
| Comparative Example 4 | 20 | Less than $1.0 \times 10^5$ | $220 \times 10^5$ | 16 | 8 |
| Comparative Example 5 | 50 | — | $0.43 \times 10^5$ | 20 | 18 |
| Comparative Example 6 | 30 | — | $0.26 \times 10^5$ | 22 | 22 |

* The values of $G'_A$ of Comparative Examples 5 and 6 are the storage moduli of the adhesive agent layers at 250° C.

As shown in Table 3, shrinking due to the heating treatment at 260° C. was reduced for the protective cover members of Examples. On the other hand, the protective cover members of Comparative Examples 1 to 4 having a small storage modulus $G'_B$ at 130 to 170° C. had a greater shrinkage X, particularly a greater shrinkage X in the MD. It is thought that the shrinkages were particularly greater in the MD because stretched porous PTFE membranes are normally manufactured by rolling in the MD and thus tend to greatly shrink in a rolling direction (MD) at high temperatures. Moreover, the shrinkage X was further increased in Comparative Examples 5 and 6 in which the non-curable acrylic adhesive agents were used for the adhesive agent layers. As to the storage modulus $G'_B$ at 130 to 170° C., in Example 1 to 4, the value of $G'_B$ gently decreased as the increase in temperature from 130° C. to 170° C. The range of $G'_B$ shown in Table 3 indicates that, the value of $G'_B$ in the temperature range from 130° C. to 170° C. is equal to or higher than the minimum value (value at 170° C.) in the temperature range. In Comparative Examples 1 to 4, the value of $G'_B$ had already been less than $1.0 \times 10^5$ Pa when the temperature reached 130° C. The value of $G'_B$ more greatly decreased due to a temperature increase to 130° C. or higher and became immeasurable by the above evaluation method.

INDUSTRIAL APPLICABILITY

The protective cover member of the present invention can be used, for example, for manufacturing a semiconductor device, such as a MEMS, and/or a circuit board including such a semiconductor device.

The invention claimed is:

1. A protective cover member configured to be placed on a face of an object, the face having an opening, the protective cover member comprising a laminate, wherein
the laminate includes: a protective membrane having a shape configured to cover the opening in a state that the member is placed on the face; and at least one adhesive agent layer, wherein
the at least one adhesive agent layer is placed only on a peripheral portion of the protective membrane,
the at least one adhesive agent layer includes a thermosetting adhesive layer having a thermosetting resin composition, and
the thermosetting resin composition has a storage modulus of $1 \times 10^5$ Pa or more to $1 \times 10^7$ Pa or less at 130 to 170° C.

2. The protective cover member according to claim 1, wherein the thermosetting resin composition has a storage modulus of $5 \times 10^5$ Pa or more to $1 \times 10^9$ Pa or less at 250° C. after thermal curing.

3. The protective cover member according to claim 1, wherein the thermosetting resin composition is an acrylic composition including an acrylic polymer.

4. The protective cover member according to claim 1, wherein
the thermosetting resin composition includes an acrylic polymer having a weight-average molecular weight of 200,000 or more to 5,000,000 or less, and
a content of the acrylic polymer in the thermosetting resin composition is 35 weight % or more to 100 weight % or less.

5. The protective cover member according to claim 3, wherein the acrylic polymer has a thermosetting group.

6. The protective cover member according to claim 5, wherein the thermosetting group is at least one selected from a group consisting of an epoxy group, a carboxy group, a hydroxy group, a carbonyl group, an aziridinyl group, and an amino group.

7. The protective cover member according to claim 3, wherein
the thermosetting resin composition further includes a thermosetting resin, and
a content of the thermosetting resin in the thermosetting resin composition is smaller than a content of the acrylic polymer in the thermosetting resin composition.

8. The protective cover member according to claim 7, wherein the thermosetting resin is a phenolic resin.

9. The protective cover member according to claim 1, wherein the at least one adhesive agent layer is in contact with the protective membrane.

10. The protective cover member according to claim 1, wherein the at least one adhesive agent layer forms a joining surface to be joined to the face of the object.

11. The protective cover member according to claim 1, wherein
the at least one adhesive agent layer comprises a first adhesive agent layer and a second adhesive agent layer, wherein the first adhesive agent layer and/or the second adhesive agent layer includes the thermosetting adhesive layer having the thermosetting resin composition, and
the laminate includes the first adhesive agent layer positioned on a first principal surface side of the protective membrane and the second adhesive agent layer positioned on a second principal surface side of the protective membrane.

12. The protective cover member according to claim 1, wherein the protective membrane has gas permeability in a thickness direction of the protective membrane.

13. The protective cover member according to claim 1, wherein the protective membrane includes a polytetrafluoroethylene membrane.

14. The protective cover member according to claim 1, wherein the protective membrane has an area of 175 mm² or less.

15. The protective cover member according to claim 1, wherein, with respect to a plan view of the protective membrane,
a ratio $L_2/L_1$ is 0.3 or less, wherein, with respect to the plane view of the protective member, $L_1$ is defined by a minimum linear dimension from a center of the protective membrane to the perimeter of the protective membrane, and $L_2$ is defined by a minimum linear dimension of a region of the adhesive agent layer that overlaps the protective membrane.

16. The protective cover member according to claim 1, being for a micro electro mechanical system (MEMS).

17. A member supplying sheet comprising:

a substrate sheet; and at least one protective cover member placed on the substrate sheet, wherein the at least one protective cover member is the protective cover member according to claim 1.

* * * * *